United States Patent
Choi et al.

(10) Patent No.: US 11,002,612 B2
(45) Date of Patent: May 11, 2021

(54) TEMPERATURE SENSOR

(71) Applicants: SK Hynix Inc., Icheon (KR); INDUSTRY-ACADEMIC COOPERATION FOUNDATION, YONSEI UNIVERSITY, Seoul (KR)

(72) Inventors: Woojun Choi, Seoul (KR); Yongtae Lee, Seoul (KR); Youngcheol Chae, Seoul (KR)

(73) Assignees: SK hynix Inc., Icheon (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 345 days.

(21) Appl. No.: 16/272,554

(22) Filed: Feb. 11, 2019

(65) Prior Publication Data

US 2020/0191660 A1 Jun. 18, 2020

(30) Foreign Application Priority Data

Dec. 17, 2018 (KR) ........................ 10-2018-0163442

(51) Int. Cl.
*H03L 7/099* (2006.01)
*H03L 7/089* (2006.01)
(Continued)

(52) U.S. Cl.
CPC ........ *G01K 7/015* (2013.01); *G11C 11/40626* (2013.01); *H03H 17/0273* (2013.01);
(Continued)

(58) Field of Classification Search
CPC .......... G01K 7/01; G01K 7/015; G11C 11/40; G11C 11/401; G11C 11/406;
(Continued)

(56) References Cited

U.S. PATENT DOCUMENTS 6,304,623 B1 * 10/2001 Richards ................... H03L 7/18
375/355
6,738,601 B1 * 5/2004 Rofougaran ........... H03B 21/01
327/427

(Continued)

OTHER PUBLICATIONS

Choi, et al., "A 0.53pJ-K2 7000μm2 Resistor-Based Temperature Sensor with an Inaccuracy of ±0.35° C. (3s) in 65nm CMOS," ISSCC, 2018. Senssion 19, Sensors and Interfaces, 19.3, pp. 3.

*Primary Examiner* — Diana J. Cheng

(57) ABSTRACT

A temperature sensor using a poly-phase filter may include: a poly-phase filter suitable for receiving a divided clock, and having passive elements coupled to have one or more negative poles and one or more positive zeros; a comparator suitable for generating a reference clock by comparing potentials of first and second filter voltages outputted from the poly-phase filter; a phase frequency detector suitable for outputting an up or down signal by comparing the phase of the reference clock to the phase of a comparison clock; a current supply unit suitable for supplying and integrating a charge current under control of the up or the down signal; an oscillator suitable for outputting an oscillation signal; a divider suitable for generating the divided clock and the comparison clock; and a buffer suitable for inverting and non-inverting the divided clock and outputting the inverted and non-inverted divided clocks.

12 Claims, 10 Drawing Sheets

(51) Int. Cl.
*H03L 7/097* (2006.01)
*G01K 7/01* (2006.01)
*H03H 17/02* (2006.01)
*G11C 11/406* (2006.01)

(52) U.S. Cl.
CPC ............ *H03L 7/0895* (2013.01); *H03L 7/097* (2013.01); *H03L 7/0992* (2013.01)

(58) Field of Classification Search
CPC .......... G11C 11/40626; H03H 17/0248; H03H 17/0264; H03H 17/0273; H03H 17/0275; H03H 17/0276; H03H 17/0277; H03H 17/0279; H03L 7/0895; H03L 7/097; H03L 7/099; H03L 7/0991; H03L 7/0992
See application file for complete search history.

(56) References Cited

U.S. PATENT DOCUMENTS

| | | | | |
|---|---|---|---|---|
| 2005/0080564 A1* | 4/2005 | Tso | .................... | H03J 1/005 |
| | | | | 375/130 |
| 2008/0089445 A1* | 4/2008 | Kuo | .................... | H04B 1/28 |
| | | | | 375/327 |
| 2018/0302214 A1* | 10/2018 | Terlemez | .............. | H04L 7/0334 |

\* cited by examiner

510

TEMPERATURE SENSOR

CROSS-REFERENCE TO RELATED APPLICATION

This application claims priority under 35 U.S.C. § 119 to Korean Patent Application No. 10-2018-163442 filed on Dec. 17, 2018, which is incorporated herein by reference in its entirety.

BACKGROUND

1. Field

Exemplary embodiments relate to a temperature sensor, and more particularly, to a temperature sensor using a poly-phase filter.

2. Discussion of the Related Art

A volatile semiconductor memory device such as a DRAM may lose information stored in a memory cell as time passes. In order to prevent such a phenomenon, an operation of rewriting the information stored in the memory cell from outside is performed in a predetermined cycle. Such an operation is referred to as a refresh. The refresh is performed through a method of sensing and amplifying data by enabling a word line one or more times within a retention time of each cell in a bank. The retention time refers to the time for which data can be retained in a cell without a refresh operation after the data has been written to the cell. Since a retention time in a mobile DRAM changes depending on the temperature, it is necessary to adjust a refresh cycle, that is, a time between refresh operations of a cell, depending on the temperature, according to the data loss time. The data loss of each cell in the mobile DRAM is caused by a leakage current. In order to prevent such a loss, a refresh cycle generation circuit is needed in the DRAM. That is, a self-refresh cycle generation circuit is required in order to generate a refresh cycle for preventing data loss in a standby mode. The self-refresh cycle generation circuit may reduce power consumption by increasing the duration of the refresh cycle at low temperature, and prevent a data loss by decreasing the duration of the refresh cycle at high temperature.

The self-refresh cycle generation circuit requires a temperature sensor to detect increases and decreases in temperature. Typically, the temperature sensor may detect temperature using a current characteristic of a PN junction diode that depends on the temperature. Since such a diode has a large size, a bipolar junction transistor (BJT) diode based on the CMOS process, which has a similar temperature characteristic to the diode, may be used to fabricate the temperature sensor. However, since the BJT diode occupies a large area, it becomes difficult to use the BJT diode as a finer process is applied. Thus, a metal-oxide-semiconductor field-effect transistor (MOSFET) may be used instead of the BJT diode. The MOSFET occupies a smaller area than the BJT diode, while maintaining a voltage characteristic change of the BJT diode that depends on the temperature. Furthermore, a dynamic-threshold MOS transistor (DTMOST) may be configured by connecting a gate, drain and bulk of the MOSFET together, such that the MOSFET has the temperature characteristic of the BJT diode. However, in order to provide high precision, low power consumption, and a small area, the unique characteristics of each DTMOST needs to be determined.

Therefore, much attention has been paid to a CMOS temperature sensor based on a resistor using a semiconductor fabrication process. The CMOS temperature sensor exceeds the performances of existing temperature sensors based on the BJT and the MOSFET, in terms of temperature resolution and energy efficiency.

Such a temperature sensor includes an RC filter configured at the front stage thereof. For example, FIG. 1A is a circuit diagram of a conventional low pass filter, and FIG. 1B is a circuit diagram of a conventional band pass filter having a Wien-bridge structure. FIG. 2A is a diagram of a phase shift at a fixed frequency of the conventional low pass filter depending on the temperature, and FIG. 2B is a diagram of a phase shift at a fixed frequency of the conventional band pass filter depending on the temperature. FIG. 3 is a diagram of a phase shift at a fixed temperature of the conventional low pass filter and the conventional band pass filter depending on frequency.

The low pass filter illustrated in FIG. 1A has a disadvantage in that a sense amplifier at a following stage thereof consumes more power because the output voltage level of the low pass filter is lower than an input voltage level thereof. The band pass filter having the Wien-bridge structure, illustrated in FIG. 1B, also has a disadvantage in that it has low temperature detection performance, because an output voltage level of the band pass filter having the Wien-bridge structure is lower than an input voltage level thereof and a phase rate of change with respect to frequency thereof is relatively small around the center frequency. The low temperature detection performance is caused by the transfer function characteristic of the band pass filter having the Wien-bridge structure. The transfer function of the band pass filter having the Wien-bridge structure is expressed as Equation 1 below, wherein R is the resistance of each of the resistors of FIGS. 1b and C is the capacitance of each of the capacitors of FIG. 1b.

$$\frac{I_{WB}(s)}{V_{IN}(s)} = \frac{Cs}{R^2C^2s^2 + 3RCs + 1} \qquad \text{[Equation 1]}$$

The phase change $\Phi_{WB}$ of the band pass filter in Equation 1 is expressed as Equation 2 below.

$$\Phi_{WB} = \tan^{-1}\frac{1 - R^2C^2\omega^2}{3RC\omega} \qquad \text{[Equation 2]}$$

The phase rate of change of the band pass filter, which is obtained by differentiating the phase change of Equation 2, is expressed as Equation 3.

$$\frac{d\Phi_{WB}}{d\omega} = -\frac{2}{3}RC\left(\omega = \frac{1}{RC}\right) \qquad \text{[Equation 3]}$$

That is, because the phase rate of change of the band pass filter having the Wien-bridge structure is as small as $-\frac{2}{3}RC$, the accuracy of the temperature detection may be degraded.

FIG. 4a is a circuit diagram of a temperature sensor using the conventional band pass filter, and FIG. 4b is a waveform diagram of the temperature sensor using the conventional band pass filter.

The temperature sensor using the conventional band pass filter includes a band pass filter 410, a current buffer 420, an integrator 430, a voltage-controlled oscillator 440 and a divider 450.

The band pass filter 410 receives a non-inverted square-wave modulating signal P and an inverted square-wave modulating signal P' through first and second input terminals thereof, respectively, and outputs a filtering current signal $I_{WB}$ to perform charging and discharging according to the cycle of the inputted square-wave signals.

The current buffer 420 receives the filtering current signal $I_{WB}$, and generates a current buffer signal $I_{CB}$ using demodulating signals Q and Q' of the non-inverted and inverted square-wave modulating signals P and P' as control signals.

The integrator 430 generates a direct current $I_{DC}$ by accumulating a current outputted from the current buffer 420, and outputs a smoothed voltage $V_{DC}$. The direct current $I_{DC}$ of the integrator 430 represents the phase information of the band pass filter 410.

The voltage-controlled oscillator 440 outputs an oscillation signal $F_{WB}$ having a frequency proportional to the magnitude of the smoothed voltage $V_{DC}$ stored in the integrator 430.

The divider 450 divides the oscillation signal outputted from the voltage-controlled oscillator 440 by 4, and outputs the non-inverted and inverted modulating signals P and P' and the non-inverted and inverted demodulating signals Q and Q'. The modulating signal P and the demodulating signal Q have a phase difference of 90 degrees therebetween.

Such a feedback circuit can produce a signal indicating the center frequency of the band pass filter 410, which depends on temperature.

However, in the temperature sensor using the conventional band pass filter, noise of the current buffer may be larger than phase noise of the voltage-controlled oscillator. As a result, the noise of the current buffer may decide the noise of the final output stage, which makes it difficult to increase the temperature resolution. Furthermore, since the current buffer and the capacitor of the integrator have a considerably large size, it is difficult to apply the current buffer and the integrator to an application such as a DRAM or microprocessor.

SUMMARY

Various embodiments are directed to a temperature sensor using a poly-phase filter, which can reduce reading power by doubling the maximum response magnitude of an output voltage relative to a supply voltage thereof, and increase the phase rate of change around the center frequency, thereby improving temperature detection resolution.

In an embodiment, a temperature sensor using a poly-phase filter may include: a poly-phase filter for receiving a divided clock, and having passive elements coupled to have one or more negative poles and one or more positive zeros; a comparator for generating a reference clock by comparing potentials of first and second filter voltages outputted from the poly-phase filter; a phase frequency detector for outputting an up signal and a down signal by comparing the phase of the reference clock outputted from the comparator to the phase of a comparison clock; a current supply for supplying and integrating a predetermined charge current under control of the up signal and the down signal; an oscillator for outputting an oscillation signal having a frequency corresponding to the current integrated by the current supply unit; a divider for generating the divided clock and the comparison clock by dividing an oscillation signal outputted from the oscillator; and a buffer for inverting and non-inverting the divided clock and outputting the inverted and non-inverted divided clocks.

In accordance with the present embodiment, the low-power temperature sensor using the poly-phase filter can reduce reading power by increasing the maximum magnitude of an output voltage in comparison to a supply voltage, and increase the phase rate of change around the center frequency, thereby improving the temperature detection resolution.

DETAILED DESCRIPTION

Figure 1A:
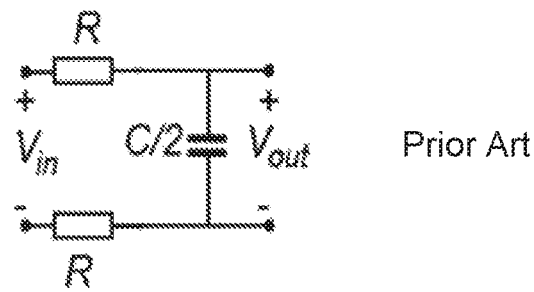
FIG. 1A is a circuit diagram of a conventional low pass filter.
Figure 1B:
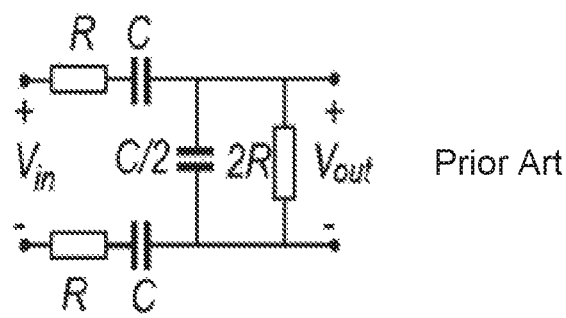
FIG. 1B is a circuit diagram of a conventional band pass filter.
Figure 2A:
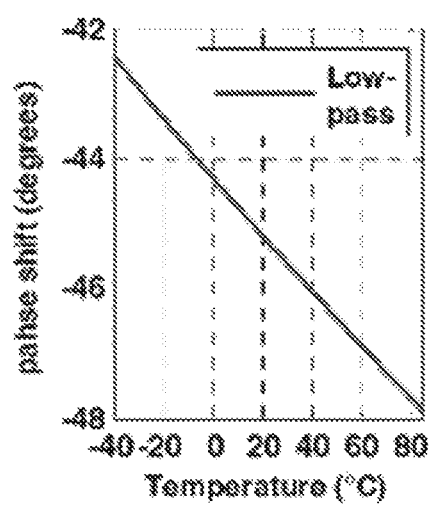
FIG. 2A is a phase shift diagram of the conventional low pass filter depending on the temperature.
Figure 2B:
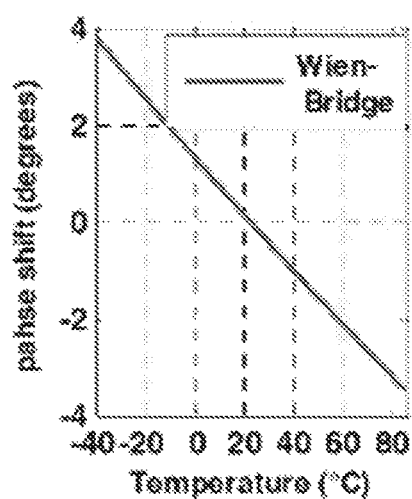
FIG. 2B is a phase shift diagram of the conventional band pass filter depending on the temperature.
Figure 3:
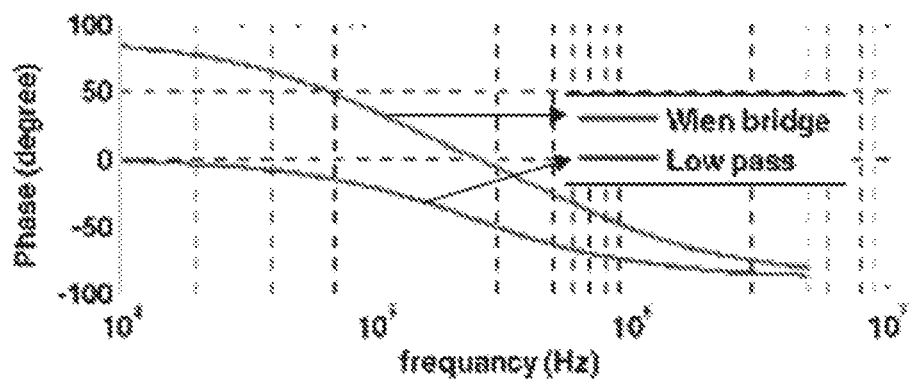
FIG. 3 is a phase shift diagram of the conventional low pass filter and the conventional band pass filter depending on the frequency.
Figure 4A:
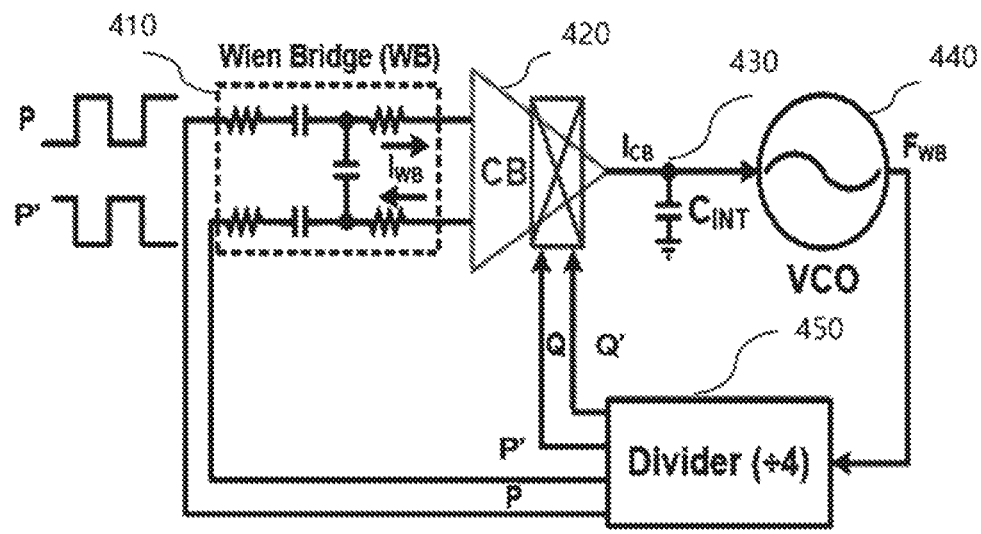
FIG. 4A is a circuit diagram of a temperature sensor using the conventional band pass filter.
Figure 4B:
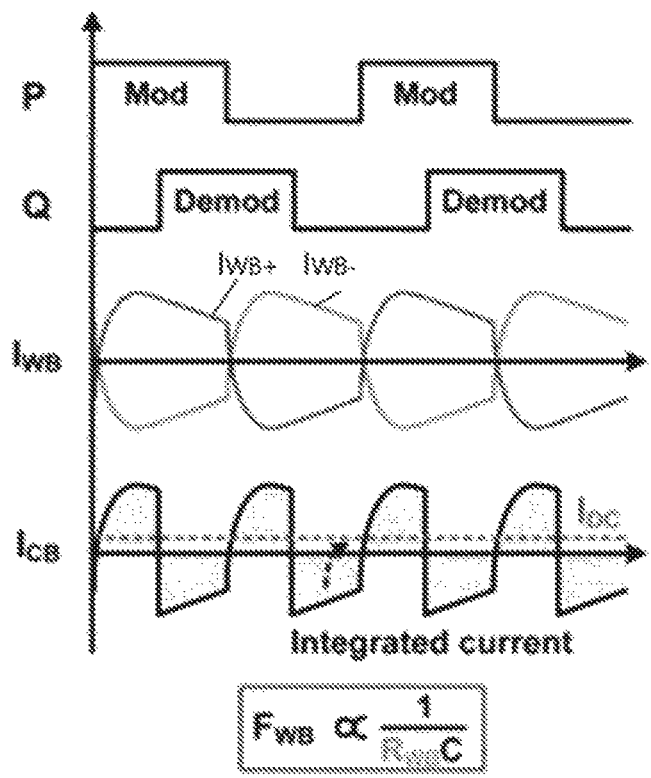
FIG. 4B is a waveform diagram illustrating an operation of the temperature sensor using the conventional band pass filter.

The advantages and characteristics of the present invention and a method for achieving the advantages and characteristics will be clearly described through the following embodiments with reference to the accompanying drawings. However, the present invention is not limited to the following embodiments, but may be embodied in various different forms. Rather, these embodiments are provided so that this disclosure will be thorough and complete, and will be fully conveyed the scope of the present invention to those skilled in the art. The present invention is only defined by the scope of claims.

The terms used in this specification are used to describe embodiments without limiting the present invention. Throughout this specification, the terms of a singular form may include plural forms unless referred to the contrary. The meaning of 'comprise' and 'comprising' used in the specification specifies a component, step, operation, and/or element but does not exclude other components, steps, operations, and/or elements.

When one element is referred to as being 'connected to' or 'coupled to' another element, it may indicate that the former element is directly connected or coupled to the latter element or still another element is interposed therebetween. On the other hand, when one element is referred to as being 'directly connected to' or 'directly coupled to' another element, it may indicate that no element is interposed therebetween. Furthermore, 'and/or' includes each of described items and one or more combinations thereof.

Throughout the specification, like reference numerals refer to the same elements. Thus, although the same or similar reference numerals are not mentioned or described in the corresponding drawing, the reference numerals may be described with reference to other drawings. Furthermore, although elements are not represented by reference numerals, the elements may be described with reference to other drawings.

Figure 5:
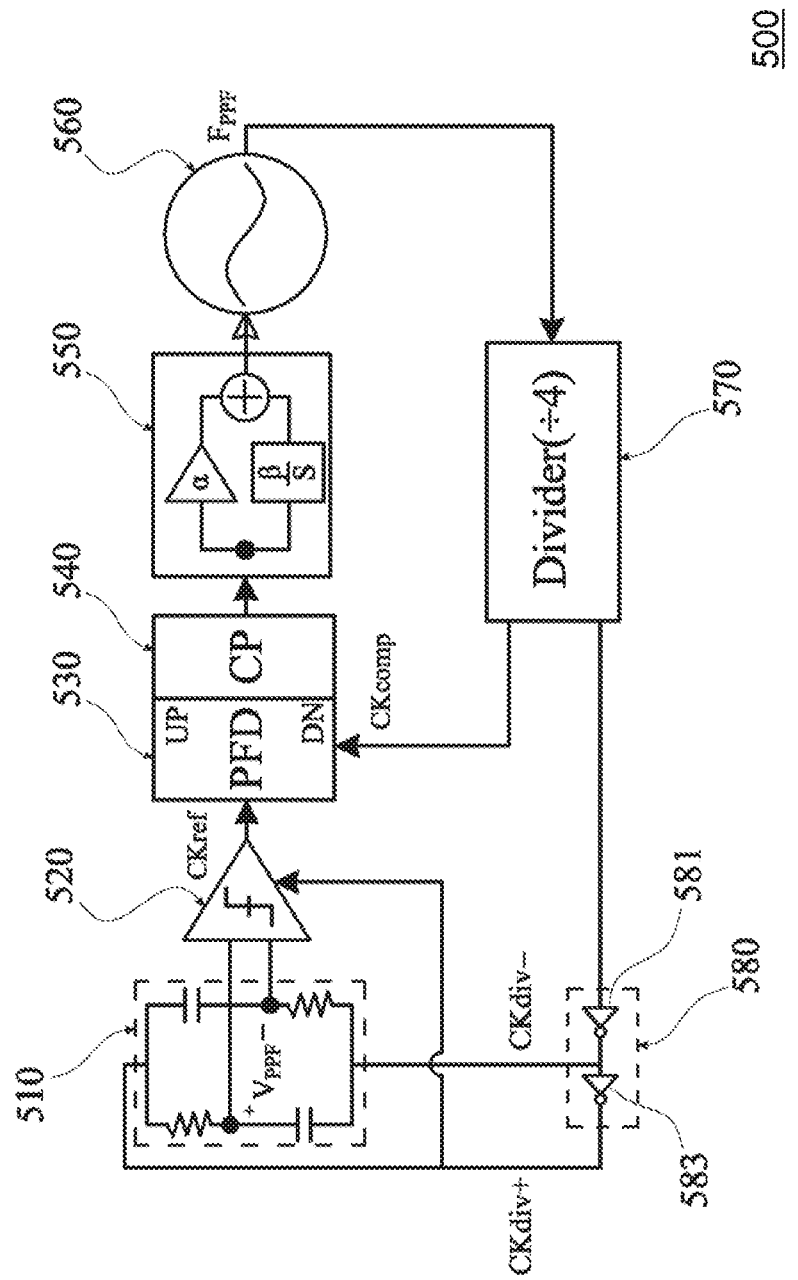
FIG. 5 is a circuit diagram of a low-power temperature sensor using a poly-phase filter in accordance with an embodiment.

FIG. 5 is a circuit diagram of a low-power temperature sensor using a poly-phase filter 500 in accordance with an embodiment.

The low-power temperature sensor using a poly-phase filter 500 in accordance with the present embodiment may include a poly-phase filter 510, a comparator 520, a phase frequency detector 530, a current supply unit including a charge pump 540 and a current controller 550, an oscillator 560, a divider 570 and a buffer 580.

Figure 6:
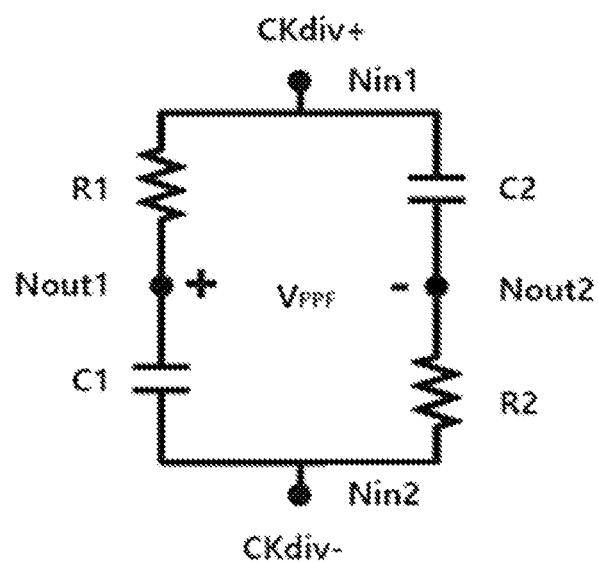
FIG. 6 is a circuit diagram of the poly-phase filter in accordance with the present embodiment.

FIG. 6 is a detailed configuration diagram of the poly-phase filter 510 illustrated in FIG. 5. As illustrated in FIG. 6, the poly-phase filter 510 in accordance with the present embodiment includes first and second resistors R1 and R2 and first and second capacitors C1 and C2 configured as a filter having a negative pole and a positive zero, and the resistors and the capacitors are alternately arranged. The negative pole and the positive zero may be described as follows. When a transfer function of the poly-phase filter is expressed through Laplace transformation, a pole is a value that makes the denominator zero, and a zero is a value that makes the numerator zero. That a pole is a negative pole indicates that the value that makes the denominator zero is a negative value, and that a zero is a positive zero indicates that the value that makes the numerator zero is a positive value.

Figure 7:
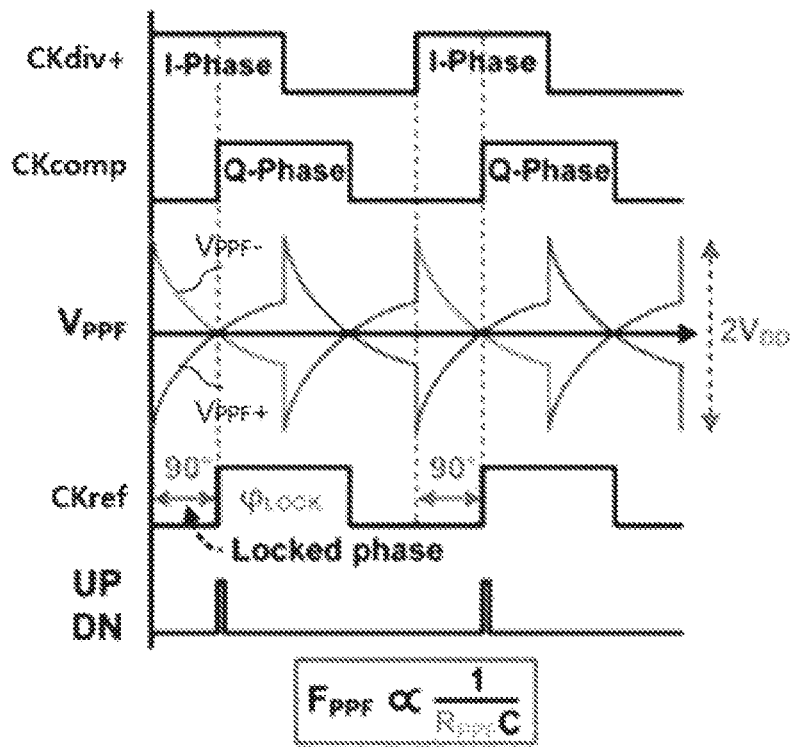
FIG. 7 is an input/output voltage waveform diagram of the poly-phase filter in accordance with the present embodiment.

FIG. 7 is an input/output voltage waveform diagram of the poly-phase filter 510 illustrated in FIG. 5. As illustrated in FIG. 7, non-inverted and inverted square-wave divided clocks CKdiv+ and CKdiv− are applied to first and second input nodes Nin1 and Nin2 of the poly-phase filter 510, respectively, and first and second filter voltages $V_{PPF+}$ and $V_{PPF-}$ each having an RC-pulse waveform with a range exceeding double the amplitude of an input supply voltage $V_{DD}$ are alternately outputted to first and second output nodes Nout1 and Nout2 in each half cycle. The amplitudes of the non-inverted and inverted square-wave divided clocks CKdiv+ and CKdiv− correspond to the supply voltage level $V_{DD}$.

In a conventional RC filter, an output voltage of the RC filter is produced at less than half the voltage of a supply voltage. As a result, a detection circuit in a following stage needs to use a large amount of power to detect temperature.

In the poly-phase filter, however, a differential output voltage of the poly-phase filter may have a magnitude exceeding double the magnitude of the supply voltage, as shown, through a transient response. When the output voltage has a large range as described above, the burden of the detection circuit in the following stage may be reduced.

Since the poly-phase filter has a negative pole and a positive zero, the phase value of the filter is changed up to −180 degrees, and the central frequency has a phase value of −90 degrees. That is, the phase value of the center frequency of the poly-phase filter in a steady state is −90 degrees.

The poly-phase filter has a transfer function which is expressed as Equation 4 below, wherein the resistances of the first and second resistors R1 and R2 are each R, and the capacitances of the first and second capacitors C1 and C2 are each C.

$$\frac{V_{PPF}(s)}{V_{IN}(s)} = \frac{1-RCs}{1+RCs} \qquad \text{[Equation 4]}$$

The phase change DPPF of the poly-phase filter of Equation 4 is expressed as Equation 5 below.

$$\Phi_{PPF} = 2\tan^{-1}(1-RC\omega) \qquad \text{[Equation 5]}$$

The phase rate of change of the poly-phase filter, which is obtained by differentiating the phase change of Equation 5, is expressed as Equation 6.

$$\frac{d\Phi_{PPF}}{d\omega} = -RC\left(\omega = \frac{1}{RC}\right) \qquad \text{[Equation 6]}$$

That is, the phase rate of change of the poly-phase filter is higher by 50% than the phase rate of change of the band pass filter having the Wien-bridge structure. As a result, the temperature detection resolution is improved.

Figure 8:
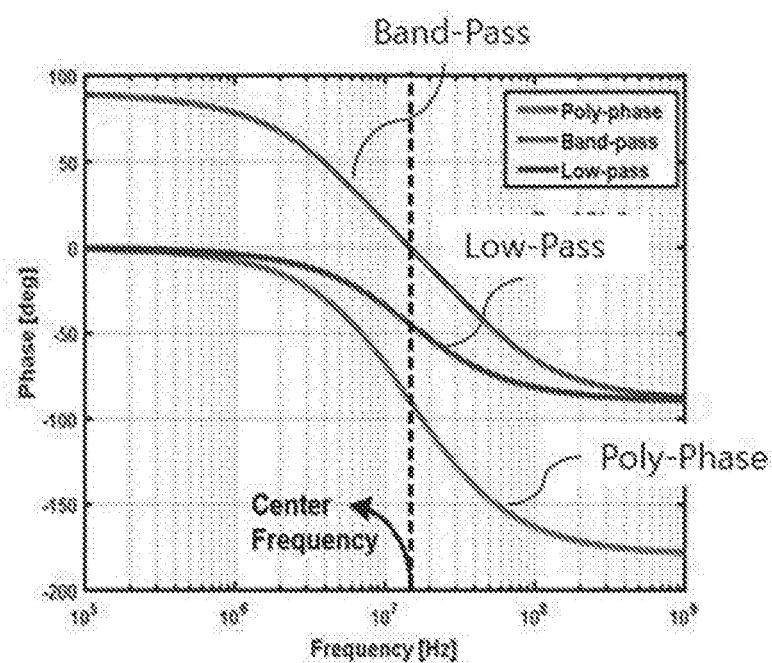
FIG. 8 is a phase shift diagram for each filter depending on the frequency.

FIG. 8 is a diagram of a phase shift of each kind of filter depending on the frequency, and shows that the low pass filter has a small phase change depending on the frequency, and the phase rate of change (i.e., the slope of the line indicating the phase) of the poly-phase filter is larger than the phase rate of change of the band pass filter around the center frequency.

Referring back to FIG. 5, the comparator 520 is enabled according to the non-inverted square-wave divided clock CKdiv+, and generates a reference clock CKref by comparing the potentials of first and second filter voltages $V_{PPF+}$ and $V_{PPF-}$ outputted from the poly-phase filter 510. When the poly-phase filter is in a steady state, the comparator 520 generates the reference clock CKref which is triggered at a time point that lags the phase of the non-inverted square-wave divided clock CKdiv+ by 90 degrees.

The phase frequency detector 530 compares the phase of the reference clock CKref outputted from the comparator 520 to the phase of a comparison clock CKcomp outputted from the divider 570 to be described below, and outputs an up/down signal UP/DN.

Figure 9A:
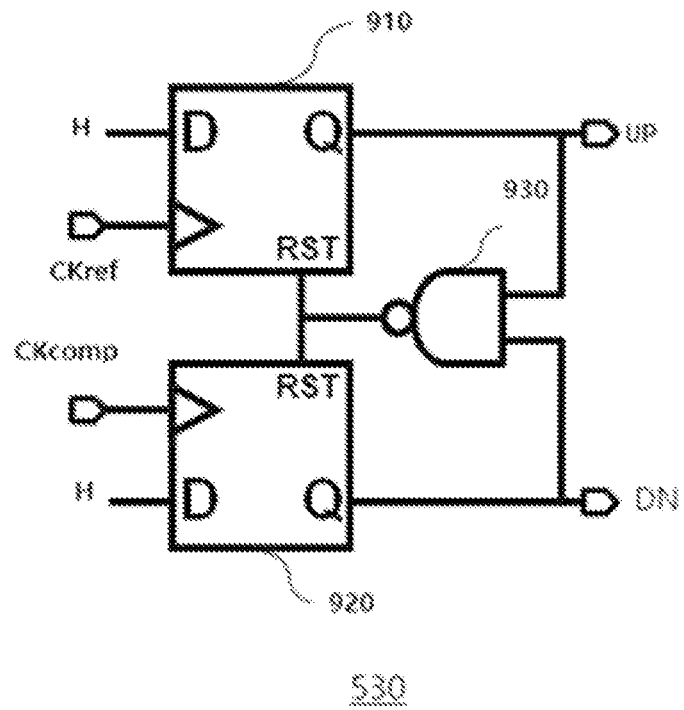
FIG. 9A is a circuit diagram of a phase frequency detector in accordance with the present embodiment.

FIG. 9A is a detailed configuration diagram of the phase frequency detector 530 illustrated in FIG. 5. The phase frequency detector 530 in accordance with the present embodiment includes first and second D flip-flops 910 and 920 and a NAND gate 930. The first and second D flip-flops 910 and 920 receive a first-level voltage through data input terminals D thereof, the first D flip-flop receives the reference clock CKref through a clock input terminal CK thereof, and the second D flip-flop receives the comparison clock CKcomp through a clock input terminal CK thereof. Therefore, the first D flip-flop 910 latches and outputs the first-level voltage according to the reference clock CKref, and the second D flip-flop 920 latches and outputs the first-level voltage according to the comparison clock CKcomp. The NAND gate 930 resets the first and second D flip-flops 910 and 920 to a second-level voltage when both of the signals outputted from the first and second D flip-flops 910 and 920 are equal to the first-level voltage. The first-level voltage may be the supply voltage $V_{DD}$ corresponding to a logic high value H. The second-level voltage may be a ground voltage corresponding to a logic low level L.

Figure 9B:
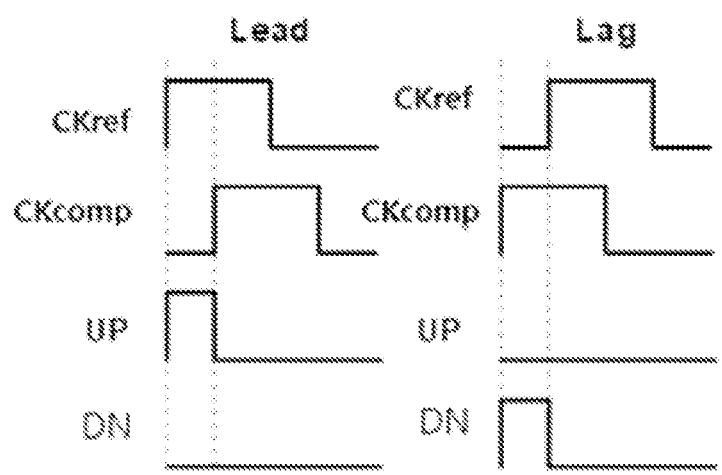
FIG. 9B is an input/output timing diagram of the phase frequency detector in accordance with the present embodiment.

FIG. 9B is an input/output signal timing diagram of the phase frequency detector 530. The phase frequency detector 530 activates the up signal UP for a duration (i.e., with a pulse width) corresponding to a phase difference between the reference clock CKref and the comparison clock CKcomp when the comparison clock CKcomp lags the reference clock CKref, and activates the down signal DN for a duration (i.e., with a pulse width) corresponding to a phase difference between the two clocks when the comparison clock CKcomp leads the reference clock CKref. When the phases of the reference clock CKref and the comparison clock CKcomp coincide with each other, the up signal UP or the down signal DN does not have a substantial width, corresponding to the insubstantial phase difference. In other words, because the phase value of the center frequency of the poly-phase filter in a steady state is −90 degrees, and the phase of the comparison clock CKcomp lags the phase of the divided clock CKdiv by 90 degrees, when the temperature sensor reaches the steady state, the phase of the reference clock CKref outputted from the comparator 520 coincides with the phase of the comparison clock CKcomp, and neither the up signal UP nor the down signal DN are activated for more than an insubstantial period of time (e.g., a time corresponding to the delay through the NAND gate 930 and reset circuits of the D flip-flops 910 and 920).

Referring back to FIG. 5, the current supply unit including the charge pump 540 and the current controller 550 is controlled by the up and down signals UP and DN, and supplies and integrates a predetermined charge current.

Specifically, the charge pump 540 within the current supply unit supplies the charge current Ic according to the respective widths of the up signal UP and the down signal DN outputted from the phase frequency detector 530.

The current controller 550 within the current supply unit integrates the charge current Ic outputted from the charge pump 540.

The oscillator 560 outputs an oscillation signal $F_{PPF}$ having a frequency corresponding to a charge voltage or the charge current Ic integrated by the current controller 550.

The divider 570 divides the oscillation signal $F_{PPF}$ outputted from the oscillator 560 by 4, and outputs the divided clock CKdiv+ and the comparison clock CKcomp. In an embodiment, the divider 570 divides the oscillation signal $F_{PPF}$ by 4, and outputs the divided clock CKdiv+ and the comparison clock CKcomp. The phase of the comparison clock CKcomp in a steady state lags the phase of the non-inverted square-wave divided clock CKdiv+ by 90 degrees.

The buffer 580 may include two or more inverters. In accordance with the present embodiment, the buffer 580 includes first and second inverters 581 and 583. The first inverter 581 inverts the divided clock CKdiv+ outputted from the divider 570 and outputs the inverted divided clock CKdiv−, and the second inverter 583 inverts the inverted divided clock CKdiv− and outputs the non-inverted divided clock CKdiv+.

When the up signal UP is outputted from the phase frequency detector 530, the charge voltage rises while the charge current Ic is integrated through the charge pump 540 and the current controller 550. Thus, the output frequency of the oscillation signal $F_{PPF}$ increases, and the rising temperature is detected. On the contrary, when the down signal DN is outputted from the phase frequency detector 530, a discharge voltage falls while a discharge current flows through the charge pump 540 and the current controller 550. Thus, the output frequency of the oscillation signal $F_{PPF}$ decreases, and the falling temperature is detected.

Figure 10A:
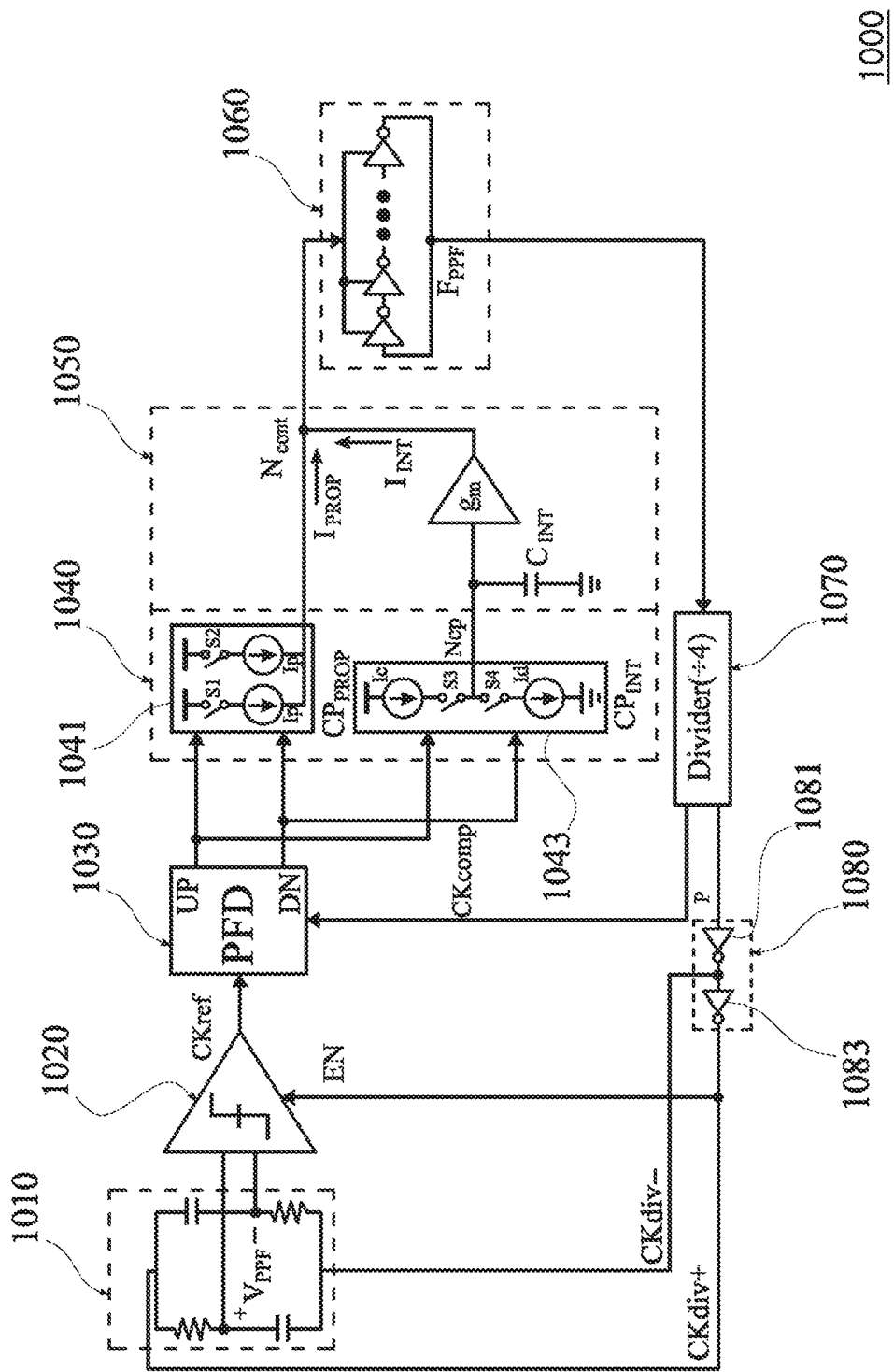
FIG. 10A is a detailed circuit diagram of a low-power temperature sensor using a poly-phase filter in accordance with an embodiment.
Figure 10B:
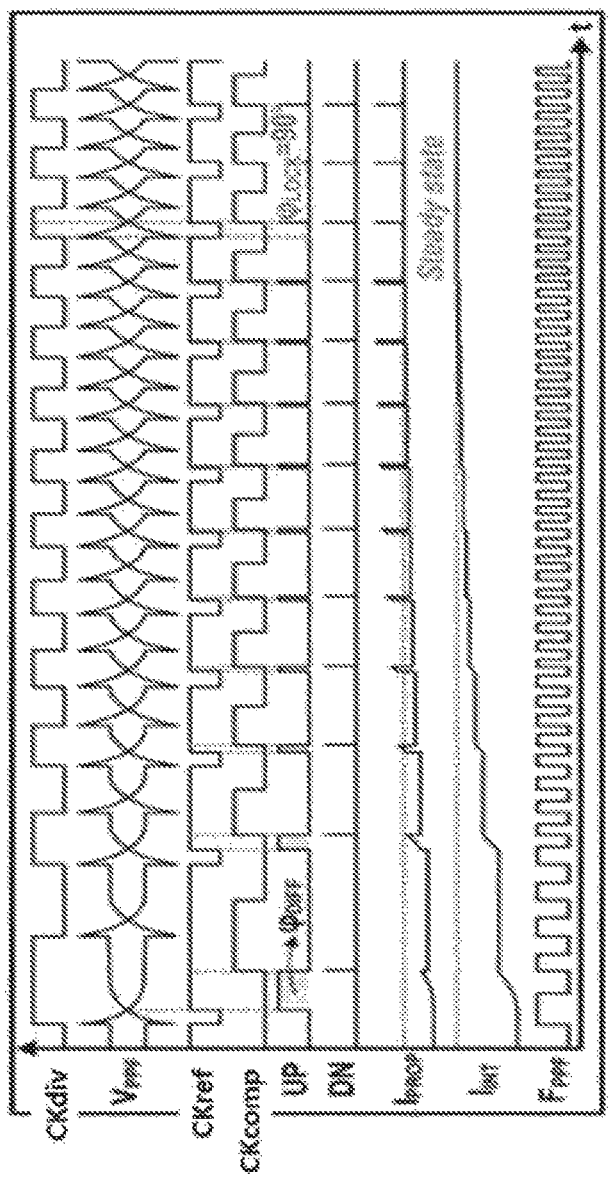
FIG. 10B is a waveform diagram illustrating an operation of the low-power temperature sensor using the poly-phase filter in accordance with the present embodiment.

FIG. 10A is a detailed circuit diagram of a temperature sensor using a poly-phase filter 1000 in accordance with an embodiment, and FIG. 10B is a waveform diagram of each unit of the temperature sensor using a poly-phase filter in accordance with the present embodiment.

Most components of the temperature sensor using the poly-phase filter 1000 in accordance with the embodiment of FIG. 10A are configured in the same manner as those of the temperature sensor using the poly-phase filter 500 in accordance with the embodiment of FIG. 5. However, the temperature sensor 1000 of FIG. 10A includes a component for proportional integration control, unlike the temperature sensor 500 of FIG. 5. That is, the temperature sensor using a poly-phase filter 1000 in accordance with the present embodiment may include a poly-phase filter 1010, a comparator 1020, a phase frequency detector 1030, a current supply unit including a charge pump 1040 and a current controller 1050, an oscillator 1060, a divider 1070 and a buffer 1080.

Specifically, the charge pump 1040 includes a proportional-current charge pump 1041 and an integrated-current charge pump 1043 which are controlled by up and down signals UP and DN outputted from the phase frequency detector 1030.

The proportional-current charge pump 1041 generates a double proportional current having a magnitude 2Ip using first and second switches S1 and S2 which are turned on by the up signal UP, and generates no proportional current using the first and second switches S1 and S2 which are turned off by the down signal DN. When neither of the up and down signals UP and DN are asserted, only one of the first and second switches S1 and S2 is turned on to generate a proportional current having a magnitude Ip. Circuits for switching the first and second switches S1 and S2 to output one of three currents 2Ip, Ip and 0 according the up signal UP and the down signal DN are known to those skilled in the art, and therefore detailed descriptions thereof are omitted herein.

The integrated-current charge pump 1043 includes a third switch S3 turned on by the up signal UP, a charge current source Ic coupled between the third switch S3 and a supply potential, a fourth switch S4 turned on by the down signal DN, a discharge current source Id coupled between the fourth switch S4 and a ground potential, and an output node Ncp coupled between the third and fourth switches S3 and S4. When the third switch S3 is turned on according to the up signal UP, the charge current Ic flows from the current source toward the output node Ncp, and when the fourth switch S4 is turned on according to the down signal DN, the discharge current Id flows from the output node Ncp toward the ground potential.

The current controller 1050 includes a proportional-current path, an integrated-current path, an integration capacitor $C_{INT}$, a gain margin unit gm, and a coupling node Ncont in which the proportional current and the integrated current are combined.

A proportional current $I_{PROP}$ outputted from the proportional-current charge pump 1041 flows through the proportional-current path.

The integrated-current path INT is coupled to the integration capacitor $C_{INT}$ and the gain margin unit gm. The integration capacitor $C_{INT}$ is placed between the integrated-current path INT and a ground terminal and charged with the charge current Ic from the charge current source Ic within the integrated-current charge pump 1043 and discharged by the discharge current Id from the discharge current source Id, and the gain margin unit gm multiplies the charge voltage stored in the integration capacitor $C_{INT}$ by a predetermined gain margin and outputs the integrated current INT.

The current-controlled oscillator 1060 generates an oscillation signal $F_{PPF}$ having a frequency proportional to the magnitude of the proportional integrated current outputted from the current controller 1050.

As illustrated in FIG. 10B, the temperature sensor may reach a steady state when a rising edge of the reference clock CKref outputted from the comparator 1020 coincides with a rising edge of the comparison clock CKcomp outputted from the divider 1070, and detect the temperature by reading the frequency $F_{PPF}$ of the oscillation signal at this time. The up signal UP and the down signal DN in the steady state have almost no width, corresponding to a phase difference $\phi_{diff}$, the width being caused by a reset delay of the phase frequency detector.

Figure 11:
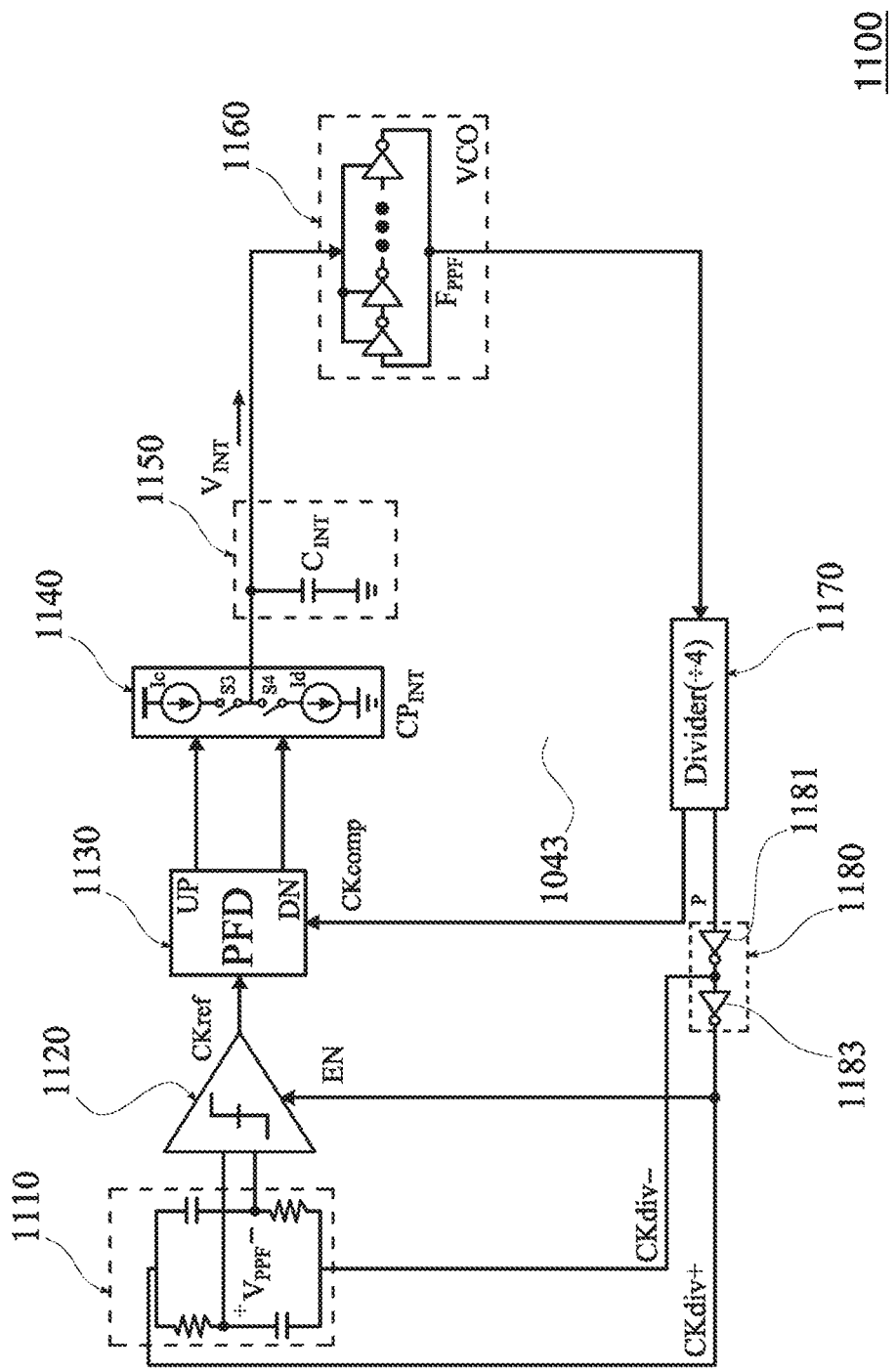
FIG. 11 is a detailed circuit diagram of a low-power temperature sensor using a poly-phase filter in accordance with another embodiment.

FIG. 11 is a detailed circuit diagram of a temperature sensor 1100 using a poly-phase filter in accordance with another embodiment. The temperature sensor 1100 using a poly-phase filter in accordance with the present embodiment may include a poly-phase filter 1110, a comparator 1120, a phase frequency detector 1130, a current supply unit including a charge pump 1140 and a current controller 1150, an oscillator 1160, a divider 1170 and a buffer 1180.

Most components of the temperature sensor using a poly-phase filter 1100 in accordance with the embodiment of FIG. 11 are configured in the same manner as those of the temperature sensor using a poly-phase filter 1000 in accordance with the embodiment of FIG. 10A. However, the temperature sensor of FIG. 11 includes a component for integration control instead of the component for proportional integration control, and generates an oscillation signal having a frequency proportional to the level of a charge voltage stored in the integration capacitor $C_{INT}$ using the voltage-controlled oscillator 1160 instead of the current-controlled oscillator 1060 of the temperature sensor of FIG. 10A.

Although various embodiments have been described for illustrative purposes, it will be apparent to those skilled in the art that various changes and modifications may be made without departing from the spirit and scope of the invention as defined in the following claims.

What is claimed is:

1. A temperature sensor using a poly-phase filter, comprising:
    a poly-phase filter for receiving a divided clock, and having passive elements coupled to have one or more negative poles and one or more positive zeros;
    a comparator for generating a reference clock by comparing potentials of first and second filter voltages outputted from the poly-phase filter;
    a phase frequency detector for outputting an up signal and a down signal by comparing the phase of the reference clock outputted from the comparator to the phase of a comparison clock;
    a current supply for supplying and integrating a predetermined charge current under control of the up signal and the down signal;
    an oscillator for outputting an oscillation signal having a frequency corresponding to the current integrated by the current supply unit;
    a divider for generating the divided clock and the comparison clock by dividing the oscillation signal outputted from the oscillator
    a buffer for inverting and non-inverting the divided clock and outputting the inverted and non-inverted divided clocks.

2. The temperature sensor of claim 1, wherein the poly-phase filter comprises a plurality of resistors and capacitors, and the resistors and the capacitors are alternately arranged.

3. The temperature sensor of claim 2, wherein the phase of the comparison clock is different by 90 degrees from the phase of the divided clock.

4. The temperature sensor of claim 2, wherein the phase frequency detector comprises:
    a first D flip-flop for receiving a first-level voltage through a data input terminal thereof, and receiving the reference clock through a clock input terminal thereof;
    a second D flip-flop for receiving the first-level voltage through a data input terminal thereof, and receiving the comparison clock through a clock input terminal thereof; and
    a NAND gate for receiving output signals of the first and second D flip-flops through an input terminal thereof, and having an output coupled to reset terminals of the first and second D flip-flops.

5. The temperature sensor of claim 2, wherein the current supply comprises:
    a charge pump for supplying the predetermined charge current under control of the up signal or the down signal; and
    a current controller for integrating the predetermined charge current outputted from the charge pump.

6. The temperature sensor of claim 5, wherein the charge pump comprises:
    a proportional-current charge pump for generating a proportional current under control of the up signal or the down signal; and
    an integrated-current charge pump for generating a charge current or discharge current under control of the up signal or the down signal.

7. The temperature sensor of claim 6, wherein the current controller comprises:
    a proportional-current path through which the proportional current flows;
    an integrated-current path through which the charge current or the discharge current flows;
    an integration capacitor disposed between the integrated-current path and a ground potential;
    a gain margin unit for multiplying a charge voltage stored in the integration capacitor by a predetermined gain margin, and outputting an integrated current; and
    a coupling node in which outputs of the proportional-current path and the gain margin unit are combined.

8. The temperature sensor of claim 7, wherein the oscillator comprises a current-controlled oscillator for generating an oscillation signal having a frequency proportional to the magnitude of the proportional integrated current outputted from the current controller circuit.

9. The temperature sensor of claim 5, wherein the charge pump comprises an integrated-current charge pump for generating a charge current or discharge current under control of the up signal or the down signal, and the current controller comprises an integration capacitor placed between an output terminal of the charge pump and a ground potential.

10. The temperature sensor of claim 9, wherein the oscillator circuit comprises a voltage-controlled oscillator for generating an oscillation signal having a frequency proportional to a level of a charge voltage stored in the current controller.

11. The temperature sensor of claim 2, wherein the poly-phase filter comprises a first resistor and a first capacitor which are coupled in series and a second capacitor and a second resistor which are coupled in series, and the first resistor and the first capacitor are coupled in parallel to the second capacitor and the second resistor.

12. The temperature sensor of claim 2, wherein the poly-phase filter comprises:

a first resistor coupled between the non-inverted divided clock and a first output terminal of the poly-phase filter circuit;

a first capacitor coupled between the inverted divided clock and the first output terminal;

a second resistor coupled between the inverted divided clock and a second output terminal of the poly-phase filter circuit; and a second capacitor coupled between the non-inverted divided clock and the second output terminal, wherein the first and second filter voltages are respectively produced at the first and second output terminals.

* * * * *